United States Patent
Sung et al.

(10) Patent No.: US 12,214,442 B2
(45) Date of Patent: Feb. 4, 2025

(54) VARIABLE-PULSE-WIDTH FLAT-TOP LASER DEVICE AND OPERATING METHOD THEREFOR

(71) Applicant: EO TECHNICS CO., LTD., Anyang-si (KR)

(72) Inventors: Kyu Dong Sung, Seoul (KR); Jeen Hur, Anseong-si (KR); Eun Kyong Moon, Anyang-si (KR); Hans Juergen Kahlert, Goettingen (DE)

(73) Assignee: EO TECHNICS CO., LTD., Anyang-si (KR)

( * ) Notice: Subject to any disclaimer, the term of this patent is extended or adjusted under 35 U.S.C. 154(b) by 0 days.

(21) Appl. No.: 18/424,662

(22) Filed: Jan. 26, 2024

(65) Prior Publication Data

US 2024/0207973 A1 Jun. 27, 2024

Related U.S. Application Data

(63) Continuation of application No. 17/799,268, filed as application No. PCT/KR2021/001525 on Feb. 5, 2021.

(30) Foreign Application Priority Data

Feb. 12, 2020 (KR) .......................... 10-2020-0017149

(51) Int. Cl.
*B23K 26/067* (2006.01)
*H01L 21/02* (2006.01)

(52) U.S. Cl.
CPC ...... *B23K 26/067* (2013.01); *H01L 21/02678* (2013.01); *H01L 21/02686* (2013.01)

(58) Field of Classification Search
CPC .......................... G02B 27/0905; G02B 27/0927
See application file for complete search history.

(56) References Cited

U.S. PATENT DOCUMENTS

| | | | |
|---|---|---|---|
| 7,855,818 B2 | 12/2010 | Nakamura | |
| 2008/0013182 A1* | 1/2008 | Ferber ................ | B23K 26/0648 359/619 |

(Continued)

FOREIGN PATENT DOCUMENTS

| | | | | |
|---|---|---|---|---|
| DE | 102007001639 A1 * | 4/2008 | ......... | B23K 26/0604 |
| JP | 2008216911 | 9/2008 | | |

(Continued)

OTHER PUBLICATIONS

Machine translation of KR20180104914-A, May 2024 (Year: 2024).*

(Continued)

*Primary Examiner* — Geoffrey S Evans
(74) *Attorney, Agent, or Firm* — BROADVIEW IP LAW, PC

(57) ABSTRACT

Provided is a laser device. A laser device includes a light source unit configured to emit a first laser beam and a second laser beam, and a beam shaping unit configured to receive the first laser beam and the second laser beam on an incident surface and to shape the first laser beam and the second laser beam into a first processing beam, wherein the beam shaping unit is further configured, to have the incident surface including four quadrants, to receive the first laser beam on a first quadrant and the second laser beam on a second quadrant, and to shape the first laser beam and the second laser beam being emitted at different timing from the first laser beam into the first processing beam.

18 Claims, 12 Drawing Sheets

(56) References Cited

U.S. PATENT DOCUMENTS

2015/0371911 A1\* 12/2015 McWhirter ............. H01L 22/26
219/121.62
2021/0138581 A1\* 5/2021 Cho ..................... H01L 21/324

FOREIGN PATENT DOCUMENTS

| JP | 2016072273 | | 5/2016 | | |
|----|------------|---|--------|---|---|
| KR | 1020140126689 | | 10/2014 | | |
| KR | 20180104913 A | \* | 9/2018 | | |
| KR | 20180104914 A | \* | 9/2018 | | |
| KR | 1020180104913 | | 9/2018 | | |
| KR | 20190043191 A | \* | 4/2019 | | |
| KR | 1020190043191 | | 4/2022 | | |
| WO | WO-2018126078 A1 | \* | 7/2018 | ......... | B23K 26/0006 |
| WO | WO-2020064108 A1 | \* | 4/2020 | ......... | G02B 21/0036 |

OTHER PUBLICATIONS

Machine translation of KR-20180104913-A, May 2024 (Year: 2024).\*
Machine translation of KR-20190043191-A, May 2024 (Year: 2024).\*
Machine translation of DE-102007001639-A1, Oct. 2024 (Year: 2024).\*
"Office Action of Korea Counterpart Application" with English translation thereof, issued on Jun. 3, 2021, p. 1-p. 10.
"Notice of Allowance of Korea Counterpart Application" with English translation thereof, issued on Aug. 23, 2021, p. 1-p. 4.

\* cited by examiner

VARIABLE-PULSE-WIDTH FLAT-TOP LASER DEVICE AND OPERATING METHOD THEREFOR

CROSS-REFERENCE TO RELATED APPLICATION(S)

This application is a continuation of U.S. patent application Ser. No. 17/799,268, filed on Aug. 12, 2022, which is a National Phase Entry Application of PCT Application No. PCT/KR2021/001525 filed on Feb. 5, 2021, which claims priority to Korean Patent Application No. 10-2020-0017149 filed on Feb. 12, 2020, in Korean Intellectual Property Office.

TECHNICAL FIELD

The present disclosure relates to a laser device and an operating method therefor, and more particularly, to a variable pulse width flat-top laser device for improving uniformity of a flat-top beam by using a plurality of laser beams and an operating method therefor.

BACKGROUND ART

As the demand for optical systems using lasers has increased in fields requiring high efficiency and precision in the semiconductor industry, beam shaping technology for changing a shape or energy distribution of a laser beam into a desired shape has been in the spotlight.

For example, a laser annealing process involves emitting a flat-top laser beam shaped into a flat-top shape to an amorphous silicon film on a wafer to crystalize the amorphous silicon film into a polysilicon film. In order to ensure process yield and reproducibility, a method of improving uniformity of the flat-top laser beam is required.

In the related art, one of methods of improving uniformity of a flat-top laser beam is a method of using a larger number of laser beams. However, this method may cause problems in that a configuration of a light source is complicated and a configuration of an optical system is longer.

DESCRIPTION OF EMBODIMENTS

Technical Problem

Provided are a variable pulse width flat-top laser device for improving uniformity of a flat-top beam and more efficiently configuring laser beams and an optical system and an operating method therefor.

Technical problems to be solved by the present disclosure are not limited to the above-described technical problems and there may be other technical problems.

Solution to Problem

In an aspect, a variable pulse width flat-top laser device includes: a light source unit including a plurality of laser light sources driven at different times to emit pulse-type laser beams; a beam shaping unit configured to shape the plurality of laser beams emitted by the light source unit into flat-top laser beams; a combination/split unit located between the light source unit and the beam shaping unit and configured to combine optical paths of the plurality of laser beams and split a combined optical path into at least two optical paths so that the split at least two optical paths are directed to different regions of an incident surface of the beam shaping unit; and an imaging optical system configured to form an image by time-sequentially overlaying the flat-top laser beams shaped by the beam shaping unit on a target object.

In an aspect, a variable pulse width flat-top laser device includes: a light source unit including first and second laser light sources driven at different times to respectively emit pulse-type first and second laser beams; a beam shaping unit configured to shape the first and second laser beams emitted from the light source unit into flat-top laser beams; a combination/split unit located between the light source unit and the beam shaping unit, and including a first beam combination/split unit configured to combine optical paths of the first and second laser beams and split a combined optical path into at least two optical paths so that the split at least two optical paths are directed to different regions of an incident surface of the beam shaping unit; and an imaging optical system configured to form an image by time-sequentially overlaying the flat-top laser beams shaped by the beam shaping unit on a target object.

In an embodiment, the first beam combination/split unit may include: a first optical path combiner configured to combine optical paths of the first and second laser beams emitted from the first and second laser light sources with a time difference; and a first beam splitter configured to split a laser beam emitted from the first optical path combiner into at least two partial laser beams.

In an embodiment, the first and second laser beams emitted from the first and second laser light sources may have a first polarization, wherein the first optical path combiner includes a half-wave plate located at an emitting end of the first laser light source and configured to convert the first polarization of the first laser beam emitted from the first laser light source into a second polarization perpendicular to the first polarization, and a polarization beam splitter configured to transmit any one of the first laser beam converted into the second polarization via the half-wave plate and the second laser beam having the first polarization and reflect the other laser beam.

In an embodiment, the first beam combination/split unit may include a path difference compensator configured to compensate for a path difference between the at least two optical paths split by the first beam splitter.

In an embodiment, the difference compensator may include a reflection member configured to extend a length of an optical path.

In an embodiment, the light source unit may further include third and fourth laser light sources driven at different times to respectively emit pulse-type third and fourth laser beams, and the combination/split unit may further include a second beam combination/split unit configured to combine optical paths of the third and fourth laser beams and split a combined optical path into at least two optical paths.

In an embodiment, the combination/split unit may be configured so that two first partial laser beams split from the first laser beam are incident on different first and second quadrants among quadrants of the incident surface of beam shaping unit, two second partial laser beams split from the second laser beams are incident on the first and second quadrants of the incident surface of the beam shaping unit, two third partial laser beams split from the third laser beam are incident on different third and fourth quadrants among the quadrants of the incident surface of the beam shaping unit, and two fourth partial laser beams split from the fourth laser beam are incident on the third and fourth quadrants of the incident surface of the beam shaping unit.

In an embodiment, the flat-top laser beams time-sequentially overlaid on the target object to form an image may have a variable pulse width that varies according to a driving time difference between the first and second laser light sources.

In an embodiment, the beam shaping unit may include a homogenizing optical system configured to spatially homogenize the at least two laser beams.

In an embodiment, the homogenizing optical system may include at least a pair of lens arrays. For example, the homogenizing optical system may include two pairs of cylindrical lens arrays. In another example, the homogenizing optical system may include a pair of rectangular lens arrays that are two-dimensionally arranged like in a rectangular grid.

In an aspect, a variable pulse width flat-top laser device includes: a light source unit including first and third laser light sources simultaneously driven to respectively emit pulse-type first and third laser beams, and second and fourth laser light sources simultaneously driven with a time difference from the first and third laser light sources to respectively emit pulse-type second and fourth laser beams; a beam shaping unit configured to shape the first through fourth laser beams emitted from the light source unit into flat-top laser beams; an optical path combiner including a first optical path combiner configured to combine optical paths of the first and second laser beams and a second optical path combiner configured to combine optical paths of the third and fourth laser beams, the optical path combiner being configured so that an optical path combined by the first optical path combiner and an optical path combined by the second optical path combiner are directed to different regions of an incident surface of the beam shaping unit; and an imaging optical system configured to form an image by overlaying the flat-top laser beams by the first through fourth laser beams on a target object.

In an embodiment, the first laser beam and the second laser beam may be time-sequentially overlaid and incident on a first region of the incident surface of the beam shaping unit, the third laser beam and the fourth laser beam are time-sequentially overlaid and incident on a second region of the incident surface of the beam shaping unit.

The light source unit further may include fifth and seventh laser light sources simultaneously driven to respectively emit pulse-type fifth and seventh laser beams and sixth and eighth laser light sources simultaneously driven with a time difference from the fifth and seventh laser light sources to respectively emit pulse-type sixth and eighth laser beams.

The optical path combiner may further include a third optical path combiner configured to combine optical paths of the fifth and sixth laser beams and a fourth optical path combiner configured to combine optical paths of the seventh and eighth laser beams, the optical path combiner being configured so that an optical path combined by the third optical path combiner and an optical path combined by the fourth optical path combiner are directed to different regions of the incident surface of the beam shaping unit.

In an embodiment, the variable pulse width flat-top laser device may further include: a stage on which the target object is mounted; and a driving module configured to generate and transmit a driving force for periodically moving the stage, wherein an annealing process is performed by emitting a flat-top laser beam to the target object.

In an aspect, an operating method of a variable pulse width flat-top laser device includes driving the first and second laser light sources at different times to respectively emit pulse-type first and second laser beams, so that the first and second laser beams are time-sequentially overlaid on a target object to form an image.

In an aspect, an operating method of a variable pulse width flat-top laser device includes: driving a first laser light source to emit a pulse-type first laser beam; splitting the first laser beam into at least two first partial laser beams and then causing the at least two first partial laser beams to be incident on different regions of an incident surface of a beam shaping unit; shaping the at least two first partial laser beams incident on the beam shaping unit into a first flat-top laser beam; driving a second laser light source with a time difference from the first laser light source to emit a pulse-type second laser beam; splitting the second laser beam into at least two second partial laser beams and then causing the at least two second partial laser beams to be incident on the different regions of the incident surface of the beam shaping unit; shaping the at least two second partial laser beams incident on the beam shaping unit into a second flat-top laser beam; and forming an image by time-sequentially overlaying flat-top laser beams by the first laser beam and flat-top laser beams by the second laser beam on a target object.

In an embodiment, a pulse width formed by temporally synthesizing a flat-top laser beam by the first laser beam and a flat-top laser beam by the second laser beam may be varied, by adjusting a driving time difference between the first and second laser light sources.

Advantageous Effects of Disclosure

In a variable pulse width flat-top laser device and an operating method therefor according to a disclosure embodiment, an optical system configuration of an existing laser processing device may be maintained, a larger number of laser beams may be controlled, and uniformity may be improved by adjusting a pulse width and energy of laser beams.

MODE OF DISCLOSURE

Figure 1:
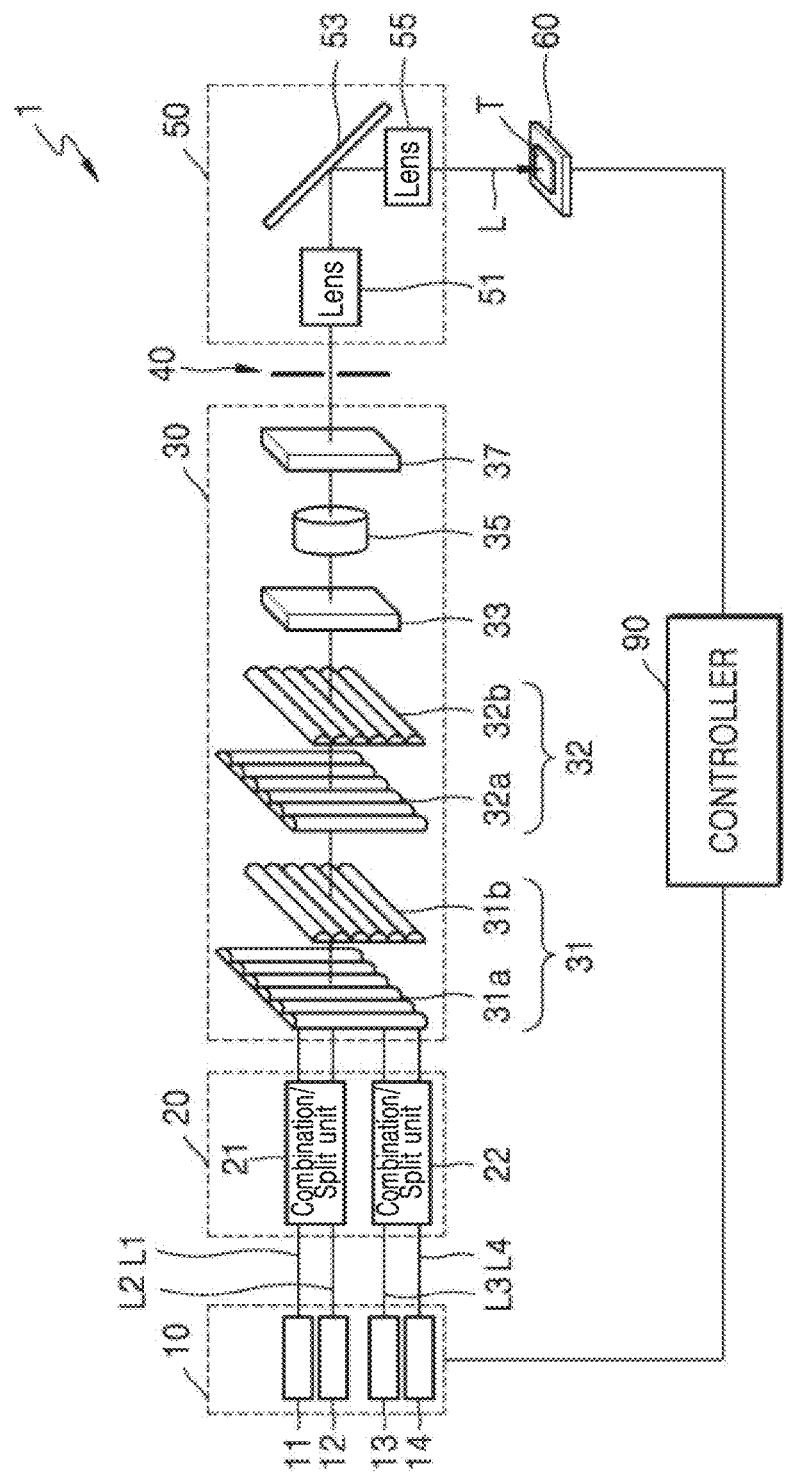
FIG. 1 is a view illustrating an optical configuration of a laser device according to an embodiment.

The advantages and features of the present disclosure and methods of achieving them will become apparent with reference to embodiments of the present disclosure described in detail below along with the attached drawings. The disclosure may, however, be embodied in many different forms and should not be construed as limited to embodiments set forth herein; rather these embodiments are provided so that this disclosure will be thorough and complete, and will fully convey the scope of the disclosure to one of ordinary skill in the art, and the scope of the disclosure is defined only by the accompanying claims. Like reference numerals denote like elements throughout, and in the drawings, sizes or thicknesses of elements may be exaggerated for clarity of explanation. In addition, portions irrelevant to the descriptions of the present disclosure will be omitted in the drawings for clear descriptions of the present disclosure.

The terms used herein will be briefly described, and the present disclosure will be described in detail.

The terms used herein are those general terms currently widely used in the art in consideration of functions in the present disclosure but the terms may vary according to the intention of one of ordinary skill in the art, precedents, or new technology in the art. Also, some of the terms used herein may be arbitrarily chosen by the present applicant, and in this case, these terms are defined in detail below. Accordingly, the specific terms used herein should be defined based on the unique meanings thereof and the whole context of the present disclosure.

It will be understood that when a certain part "includes" a certain component, the part does not exclude another component but may further include another component, unless the context clearly dictates otherwise.

FIG. 1 is a view illustrating an optical configuration of a laser device 1 according to an embodiment.

Referring to FIG. 1, the laser device 1 of the present embodiment may include a light source unit 10, a combination/split unit 20, a beam shaping unit 30, and an imaging optical system 50. The laser device may be a laser processing device used in a semiconductor process such as annealing.

The light source unit 10 includes first through fourth laser light sources 11, 12, 13, and 14. The first through fourth laser light sources 11, 12, 13, and 14 may be driven at different times by a controller 90 to respectively emit first through fourth laser beams L1, L2, L3, and L4 having a pulse waveform. An order of driving the first through fourth laser light sources L1, L2, L3, and L4 may vary according to an optical system arrangement of the combination/split unit 20.

All of the first through fourth laser beams L1, L2, L3, and L4 may be polarized. The first through fourth laser light sources 11, 12, 13, and 14 themselves may be laser devices that emit a polarized laser beam, or a polarizer may be provided at an emitting end of each of the first through fourth laser light sources 11, 12, 13, and 14. For example, the first through fourth laser beams L1, L2, L3, and L4 emitted by the first through fourth laser light sources 11, 12, 13, and 14 may be linearly polarized.

The combination/split unit 20 may include a first beam combination/split unit 21 configured to combine optical paths of the first and second laser beams L1 and L2 and split a combined optical path into at least two optical paths, and a second beam combination/split unit 22 configured to combine optical paths of the third and fourth laser beams L3 and L4 and split a combined optical path into at least two optical paths.

Figure 2:
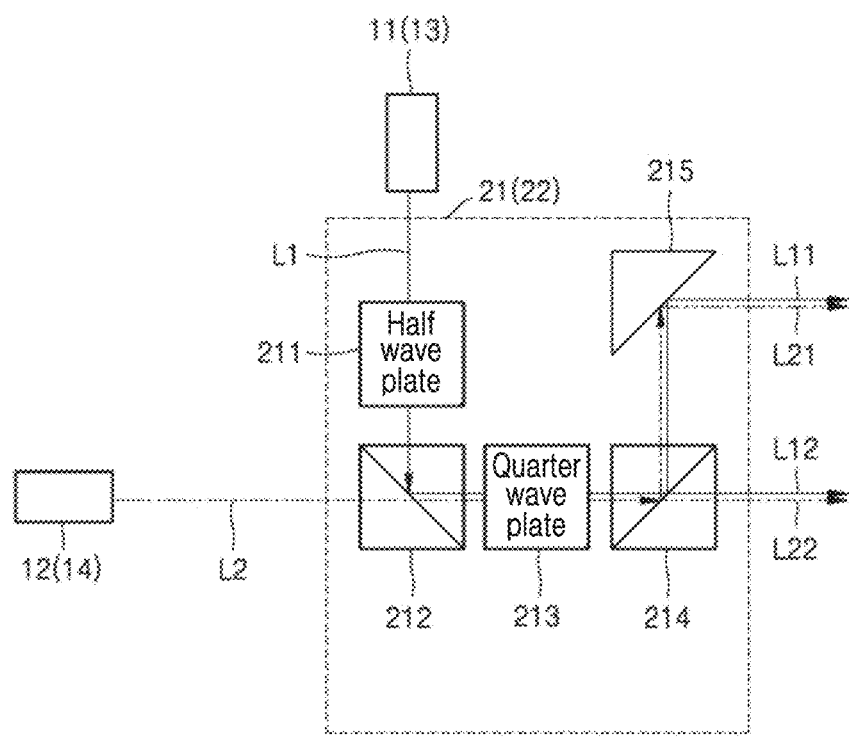
FIG. 2 is a view illustrating an optical configuration of a combination/split unit according to an embodiment.

FIG. 2 is a view illustrating an optical configuration of the first beam combination/split unit 21 according to an embodiment. Referring to FIG. 2, the first beam combination/split unit 21 may include a first optical path combiner configured to combine optical paths of the first and second laser beams L1 and L2, and a first beam splitter configured to split a laser beam emitted from the first optical path combiner into at least two partial laser beams. Because the first and second laser beams L1 and L2 may be polarized into a first polarization (e.g., P polarization), the first optical path combiner and the first beam splitter may use the polarization.

The first optical path combiner may include a combination of a half-wave plate 211 and a first polarization beam splitter 212. The half-wave plate 211 may be located at an emitting end of the first laser light source 11 and may convert the first polarization (P polarization) of the first laser beam L1 into a second polarization (S polarization) perpendicular to the first polarization. The first polarization beam splitter 212 may be a cubic optical element configured to transmit a laser beam of the first polarization (e.g., P polarization) and reflect a laser beam of the second polarization (e.g., S polarization) perpendicular to the first polarization. The first polarization beam splitter 212 may include a first incident surface, a second incident surface, an exit surface, and a polarization-selective reflection layer that is diagonally provided thereinside. The exit surface may face the second incident surface. When the first laser beam L1 converted into the second polarization (S polarization) by the half-wave plate 211 is incident on the first incident surface, the first laser beam L1 is reflected by the polarization-selective reflection layer and is emitted through the exit surface. When the second laser beam L2 having the first polarization (P polarization) is incident on the second incident surface, the second laser beam L2 passes through the polarization-selective reflection layer and is emitted through the exit surface. As a result, an optical path of the first laser beam L1 converted into the second polarization (S polarization) and an optical path of the second laser beam L2 having the first polarization (P polarization) are combined into one optical path after being emitted from the first polarization beam splitter 212. Because the first laser light source 11 and the second laser light source 12 are time-sequentially driven, the first laser beam L1 and the second laser beam L2 time-sequentially travel along one optical path combined through the first optical path combiner.

The first beam splitter may include a quarter-wave plate 213, a second polarization beam splitter 214, and an optical path conversion member 215. The quarter-wave plate 213 is an optical element that converts light of a linear polarization into light of a circular polarization. For example, the first laser beam L1 converted into the second polarization (S polarization) may be converted into a beam of a circular polarization through the quarter-wave plate 213, and the second laser beam L2 having the first polarization (P polarization) may be converted into a beam of a circular polarization through the quarter-wave plate 213.

The second polarization beam splitter 214 may include an incident surface, a first exit surface, a second exit surface, and a polarization-selective reflection layer that is diagonally provided thereinside. The second exit surface may face the incident surface. The first laser beam L1 of the circular polarization incident on the incident surface of the second polarization beam splitter 214 may be split into a 1-1th partial laser beam L11 of a second polarization (e.g., S polarization) component and a 1-2th partial laser beam L12 of a first polarization (e.g., P polarization) component by the polarization-selective reflection layer. The 1-1th partial laser beam L11 and the 1-2th partial laser beam L12 may be split to have uniform sizes (i.e., energy). Likewise, the second laser beam L2 of the circular polarization incident on the incident surface of the second polarization beam splitter 214 may be split into a 2-1th partial laser beam L21 of the second polarization (e.g., S polarization) component and a 2-2th partial laser beam L22 of the first polarization (e.g., P polarization) component by the polarization-selective reflection layer. For example, the 1-1th partial laser beam L11 and the 2-1th partial laser beam L21 may be emitted through the first exit surface of the second polarization beam splitter 214, and the 1-2th partial laser beam L12 and the 2-2th partial laser beam L22 may be emitted through the second exit surface of the second polarization beam splitter 214. The 2-1th partial laser beam L21 and the 2-2th partial laser beam L22 may also be split to have uniform sizes (i.e., energy).

The optical path conversion member 215 may be further provided in the first beam splitter. The optical path conversion member 215 may include, for example, one or more reflection mirrors or total reflection prisms. A first optical path split from the first exit surface of the second polarization beam splitter 214 (i.e., an optical path through which the 1-1th partial laser beam L11 and the 2-1th partial laser beam L21 travel) is configured to be directed to a first region (e.g., R1 of FIG. 6) of an incident surface of the beam shaping unit 30 by the optical path conversion member 215. A second optical path split from the second exit surface of the second polarization beam splitter 214 (i.e., an optical path through which the 1-2th partial laser beam L12 and the 2-2th partial laser beam L22 travel) is configured to be directed to a second region (e.g., R2 of FIG. 6) different from the first region of the incident surface of the beam shaping unit 30. An optical path conversion member (not shown) may also be provided in the second optical path.

The second beam combination/split unit 22 may include a second optical path combiner configured to combine optical paths of the third and fourth laser beams L3 and L4, and a second beam splitter configured to split a laser beam emitted from the second optical path combiner into at least two partial laser beams. A third optical path split from the second beam splitter (e.g., an optical path through which a 3-2th partial laser beam L33 and a 4-3th partial laser beam L43 travel) is configured to be directed to a third region (e.g., R3 of FIG. 6) of the incident surface of the beam shaping unit 30, and a fourth optical path (e.g., an optical path through which a 3-4th partial laser beam L34 and a 4-4th partial laser beam L44 travel) is configured to be directed to a fourth region (e.g., R4 of FIG. 6) different from the third region of the incident surface of the beam shaping unit 30. An optical configuration of the second beam combination/split unit 22 is substantially the same as that of the first beam combination/split unit 21, and thus, a repeated description will be omitted.

Figure 3:
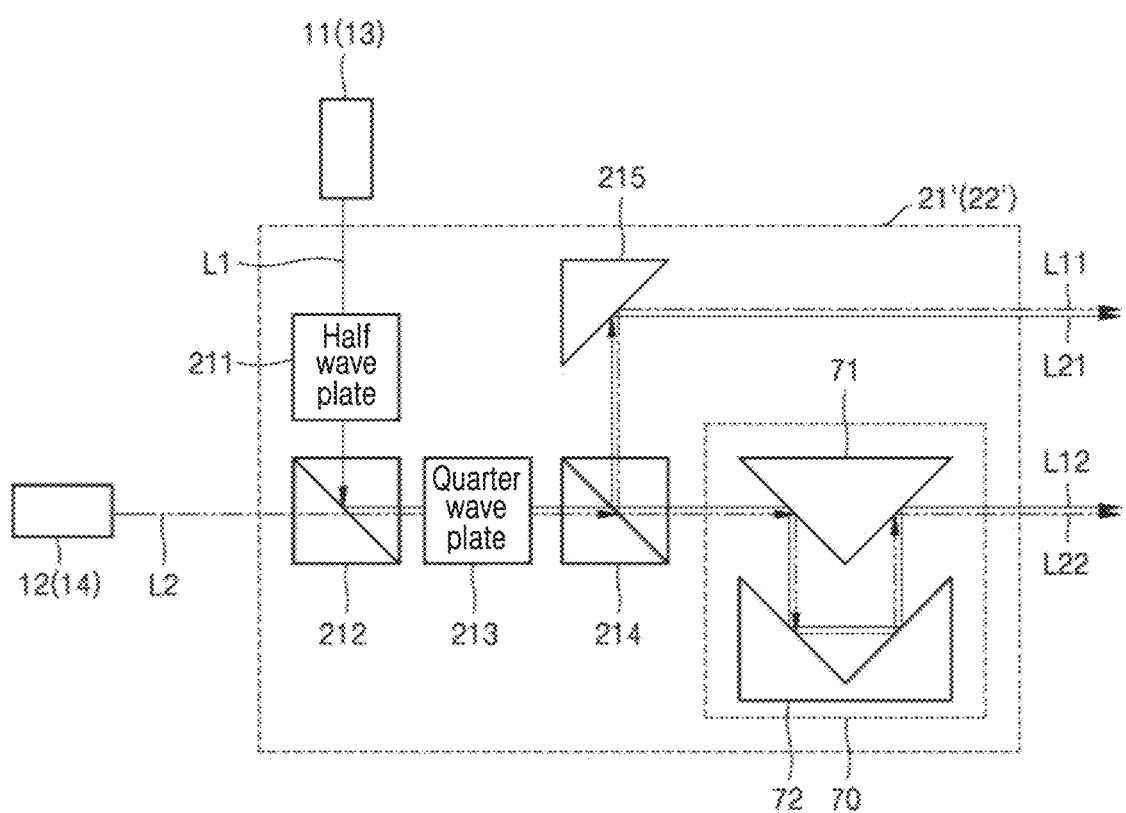
FIG. 3 is a view illustrating an optical configuration of a combination/split unit according to another embodiment.

FIG. 3 is a view illustrating an optical configuration of a first beam combination/split unit 21' according to another embodiment. Referring to FIG. 3, the first beam combination/split unit 21' may further include a path difference compensator 70, in addition to the first optical path combiner configured to combine optical paths of the first and second laser beams L1 and L2 and the first beam splitter configured to split a laser beam emitted from the first optical path combiner into at least two partial laser beams. The first optical path combiner and the first beam splitter are substantially the same as those of the first beam combination/split unit 21, and thus, a repeated description will be omitted.

A distance between the incident surface of the beam shaping unit 30 and a first optical path split from the second polarization beam splitter 214 (i.e., an optical path through which the 1-1th partial laser beam L11 and the 2-1th partial laser beam L21 travel) and a distance between the incident surface of the beam shaping unit 30 and a second optical path split from the second polarization beam splitter 214 (i.e., an optical path through which the 1-2th partial laser beam L12 and the 2-2th partial laser beam L22 travel) may be different from each other. For example, a path difference between the first optical path and the second optical path may be tens of cm, and this distance may cause a time difference of several nsec. As a result, a time difference may occur in timings at which laser beams emitted by one laser light source and then split (e.g., the 1-1th partial laser beam L11 and the 1-2th partial laser beam L12) are emitted to a target object T, thereby badly affecting beam uniformity or making inaccurate a timing of a controlled laser beam. The path difference compensator 70 is located in the first optical path or the second optical path and is configured to compensate for such a path difference. For example, the path difference compensator 70 may include a plurality of reflection members 71 and 72 and may extend an optical path. The reflection members 71 and 72 may be, for example, reflection mirrors or total reflection prisms. The plurality of reflection members 71 and 72 illustrated in FIG. 1 are merely an example, and a path difference may be compensated for by using one reflection member, or three or more reflection members.

Referring back to FIG. 1, the beam shaping unit 30 is configured to shape the first through fourth laser beams L1, L2, L3, and L4 emitted at different times from the light source unit 10 into flat-top laser beams L. For example, the beam shaping unit 30 may include a homogenizing optical system 31. The homogenizing optical system 31 may include, for example, two pairs of cylindrical lens arrays 31 and 32. For example, the first pair of cylindrical lens arrays 31 may include a first cylindrical lens array 31a and a second cylindrical lens array 31b. The second pair of cylindrical lens arrays 32 may be arranged in succession to the first pair of cylindrical lens arrays 31, and may include a third cylindrical lens array 32a and a fourth cylindrical lens array 32b. The first and third cylindrical lens arrays 31a and 32a may include a plurality of cylindrical lenses that are arranged in a first direction, and the second and fourth cylindrical lens arrays 31b and 32b may include a plurality of cylindrical lenses that are arranged in a second direction perpendicular to the first direction.

In another example, the homogenizing optical system 31 may include a pair of rectangular lens arrays (not shown). The pair of rectangular lens arrays may include a plurality of rectangular lenses that are two-dimensionally arranged like in a rectangular grid.

The beam shaping unit 30 may further include a plurality of optical lenses 33 and 37. For example, the plurality of optical lenses 33 and 37 may constitute a relay lens group. A shutter 35 such as an aperture may be located between the plurality of optical lenses 33 and 37. Although the plurality of optical lenses 33 and 37 are located on an emitting side of the two pairs of cylindrical lens arrays 31 and 32 in FIG. 1, a lens (not shown) may be additionally located on an incident side of the two pairs of cylindrical lens arrays 31 and 32.

The imaging optical system 50 includes one or more lenses 51 and 55, and is configured to enlarge or reduce the flat-top laser beams L shaped by the beam shaping unit 30 and form an image on the target object T. The imaging optical system 50 may further include a reflection member 53 configured to change optical paths of the flat-top laser beams L. The reflection member 53 may be, for example, a reflection mirror or a total reflection prism. The target object T may be mounted on a stage 60, and may be moved under the control by the controller 90 of the stage 60.

The laser device 1 may further include a mask 40 configured to shape a beam cross-section. The mask 40 may shape a size and/or a shape of the flat-top laser beams 1 shaped by the beam shaping unit 30. The mask 40 may be located between the beam shaping unit 30 and the imaging optical system 50, or may be located in an optical path in the imaging optical system 50.

Next, an operation of the laser device 1 of the present embodiment will be described with reference to FIGS. 4 through 10.

Figure 4:
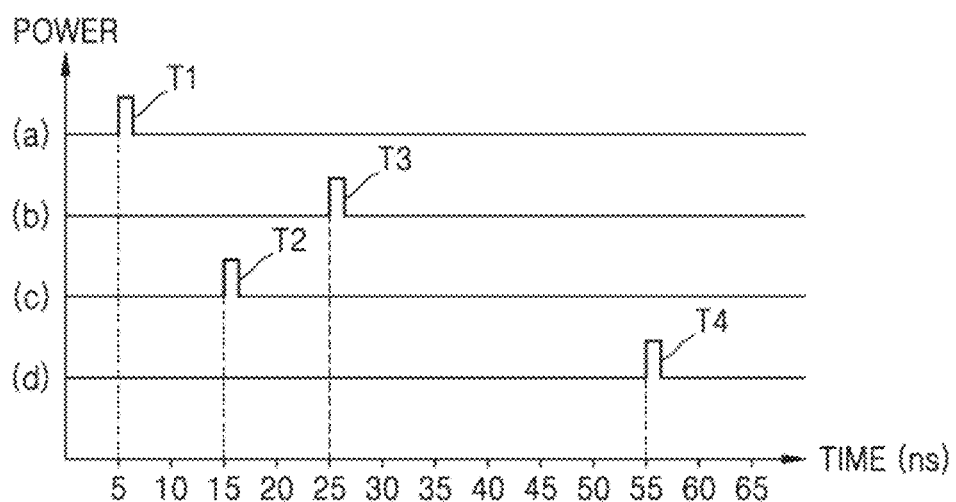
FIG. 4 illustrates driving timings of laser light sources in the laser device of FIG. 1.
Figure 5:
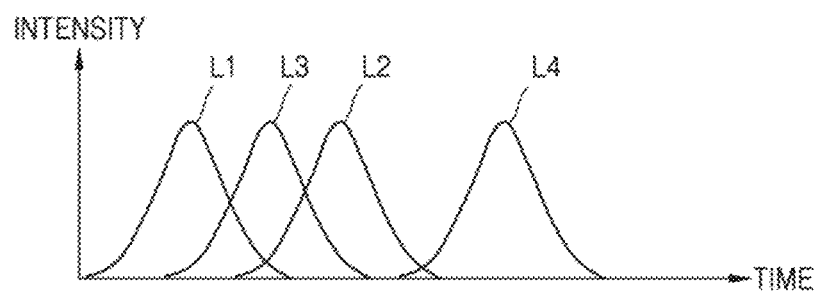
FIG. 5 illustrates pulses of a laser beam emitted by a light source unit of FIG. 1.
Figure 6:
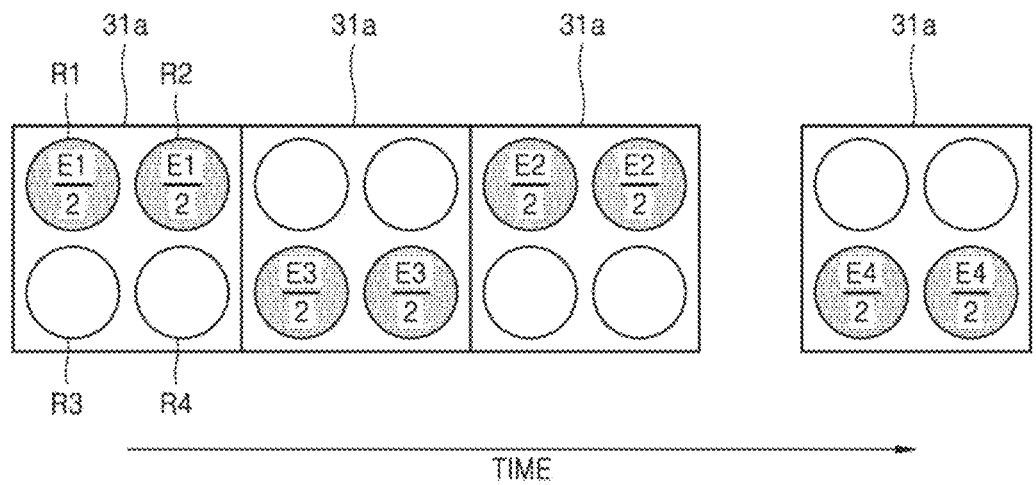
FIG. 6 is a view illustrating an energy distribution of beams combined and split by a combination/split unit and incident on a beam shaping unit in the laser device of FIG. 1.

FIG. 4 illustrates driving timings of laser light sources in the laser device 1 of FIG. 1. FIG. 5 illustrates pulses of laser beams emitted by the light source unit 10 of FIG. 1. FIG. 6 is a view illustrating an energy distribution of beams combined and split by a combination/split unit and incident on a beam shaping unit in the laser device 1 of FIG. 1.

(a) of FIG. 4 shows a driving timing T1 of the first laser light source 11, (b) of FIG. 4 shows a driving timing T3 of the second laser light source 12, (c) of FIG. 4 shows a driving timing T2 of the third laser light source 13, and (d) of FIG. 4 shows a driving timing T4 of the fourth laser light source 14. Referring to FIG. 4, the controller 90 may drive the first laser light source 11, the third laser light source 13, the second laser light source, and the fourth laser light source 14 in the order of the driving timings T1, T2, T3, and T4. The driving order is merely an example, and may vary according to an optical system arrangement of the combination/split unit 20.

Referring to FIG. 5, each of the first through fourth laser beams L1, L2, L3, and L4 emitted by the first through fourth laser light sources 11, 12, 13, and 14 may have a pulse waveform. For example, each of the first through fourth laser beams L1, L2, L3, and L4 may have a pulse width of sub-ns to hundreds of ns, and pulse widths and intensities of the first through fourth laser beams L1, L2, L3, and L4 may be the same. The first through fourth laser light sources 11, 12, 13, and 14 may be driven with a time difference of sub-ns to hundreds of ns. A driving time difference between the first through fourth laser light sources 11, 12, 13, and 14 may vary according to a processing condition of the target object T, and some may be the same and some may be different. For example, as shown in FIGS. 4 and 5, a heating temperature of the target object T in an annealing process may be appropriately maintained, by setting a driving time difference between the second laser light source 12 and the fourth laser light source 14 to be longer than a driving time difference between the first through third laser light sources 11, 12, and 13.

Referring to FIG. 6, the first through fourth laser beams L1, L2, L3, and L4 are combined and split by the combination/split unit 20 and are incident on an incident surface of the beam shaping unit 30 (i.e., an incident surface of the first lens array 31a). Four optical paths split by the combination/split unit 20 are directed to different regions (i.e., first through fourth regions R1, R2, R3, and R4) of the incident surface of the beam shaping unit 30. The first through fourth regions R1, R2, R3, and R4 may each be one quadrant when the incident surface is split into quadrants.

The first laser beam L1 emitted at the driving time T1 is split into the 1-1th and 1-2th partial laser beams L11 and L12, and the 1-1th and 1-2th laser beams L11 and L12 are respectively incident on the first region R1 and the second region R2 of the incident surface of the beam shaping unit 30. Because each of the 1-1th and 1-2th partial laser beams L11 and L12 has ½ of energy E1 of the first laser beam L1, energy of E1/2 is incident on each of the first region R1 and the second region R2 during the driving timing T1.

The third laser beam L3 emitted at the driving timing T2 is split into the 3-3th and 3-4th partial laser beams L33 and L34, and the 3-3th and 3-4th partial laser beams L33 and L34 are respectively incident on the third region R3 and the fourth region R4 of the incident surface of the beam shaping unit 30. Because each of the 3-3th and 3-4th partial laser beams L33 and L34 has ½ of energy E3 of the third laser beam L3, energy of E3/2 is incident on each of the third region R3 and the fourth region R4 during the driving timing T2.

The second laser beam L2 emitted at the driving timing T3 is split into the 2-1th and 2-2th partial laser beams L21 and L22, and the 2-1th and 2-2th partial laser beams L21 and L22 are respectively incident on the first region R1 and the second region R2 of the incident surface of the beam shaping unit 30. Because each of the 2-1th and 2-2th partial laser beams L21 and L22 has ½ of energy E2 of the second laser beam L2, energy of E2/2 is incident on each of the first region R1 and the second region R2 during the driving timing T3.

The fourth laser beam L4 emitted at the driving timing T4 is split into the 4-3th and 4-4th partial laser beams L43 and L44, and the 4-3th and 4-4th partial laser beams L43 and L44 are respectively incident on the third region R3 and the fourth region R4 of the incident surface of the beam shaping unit 30. Because each of the 4-3th and 4-4th partial laser beams L43 and L44 has ½ of energy E4 of the fourth laser beam L4, energy of E4/2 is incident on each of the third region R3 and the fourth region R4 during the driving timing T4. The energies E1, E2, E3, and E4 may have the same size, but the present disclosure is not limited thereto.

The 1-1th and 1-2th partial laser beams L11 and L12 split by the combination/split unit 20 at the driving timing T1 are homogenized, combined again, and shaped by the beam shaping unit 30 so that a beam intensity of a cross-section has a flat-top shaped distribution, and are emitted to the target object T. The 3-3th and 3-4th partial laser beams L33 and L34 split by the combination/split unit 20 at the driving timing T2 are homogenized, combined again, and shaped by the beam shaping unit 30 so that a beam intensity of a cross-section has a flat-top shaped distribution, and are emitted to the target object T. The 2-1th and 2-2th partial laser beams L21 and L22 split by the combination/split unit 20 at the driving timing T3 are homogenized, combined again, and shaped by the beam shaping unit 30 so that a beam intensity of a cross-section has a flat-top shaped distribution, and are emitted to the target object T. The 4-3th and 4-4th partial laser beams L43 and L44 split by the combination/split unit 20 at the driving timing T4 are homogenized, combined again, and shaped by the beam shaping unit 30 so that a beam intensity of a cross-section has a flat-top shaped distribution, and are emitted to the target object T. The flat-top laser beams emitted to the target object T may be time-sequentially overlaid and may be considered as a flat-top laser beam having a variable pulse width. An overall pulse width of a laser beam may be varied, by appropriately setting the driving timings T1, T2, T3, and T4, and a heating temperature of a processing surface of the target object T may be adjusted to an appropriate level.

Figure 7:
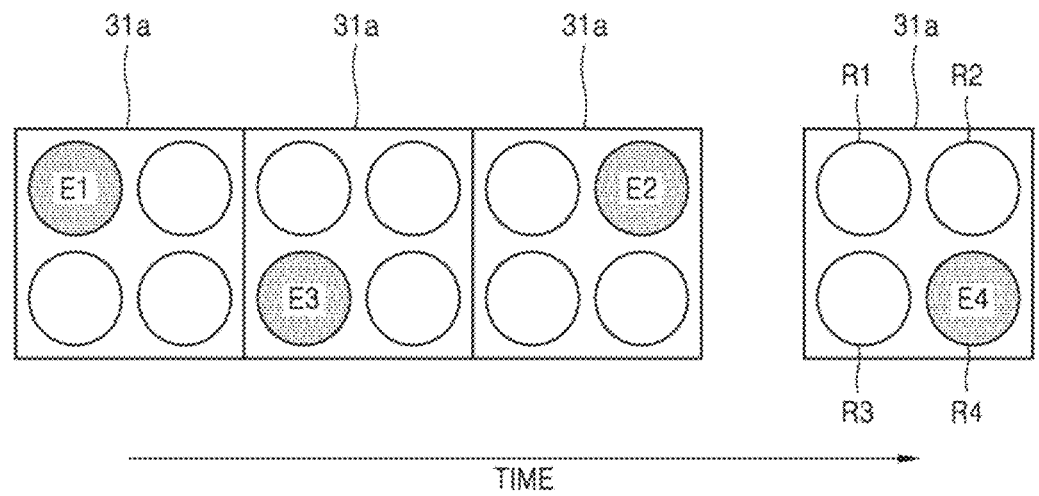
FIG. 7 is a view illustrating an energy distribution of beams incident on a beam shaping unit in a laser device according to a comparative example.

FIG. 7 is a view illustrating an intensity distribution of beams incident on a beam shaping unit in a laser device according to a comparative example. Referring to FIG. 7, the laser device according to the comparative example has an optical system in which a combination/split unit of the laser device 1 of the above embodiment is omitted. In this case, the first through fourth laser beams L1, L2, L3, and L4 are respectively emitted to quadrants (i.e., the first through fourth regions R1, R2, R3, and R4) of an incident surface of the beam shaping unit 30.

Figure 8A:
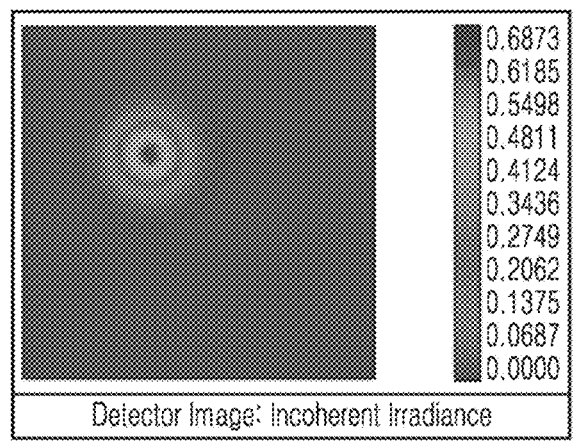
FIG. 8A is a cross-sectional view illustrating an intensity distribution of beams incident on a beam shaping unit in a laser device according to a laser device of a comparative example.
Figure 8B:
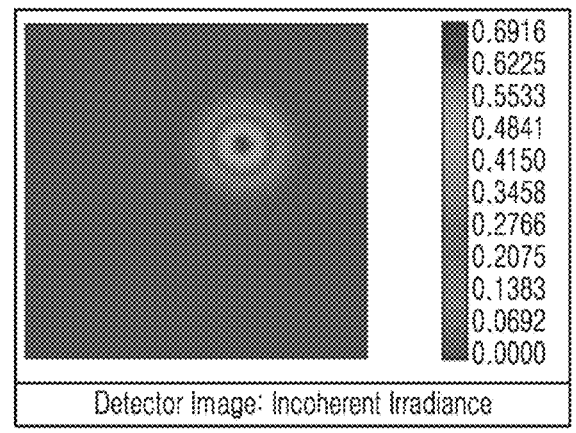
FIG. 8B is a cross-sectional view illustrating an intensity distribution of beams incident on a beam shaping unit in a laser device according to a laser device of a comparative example.
Figure 8C:
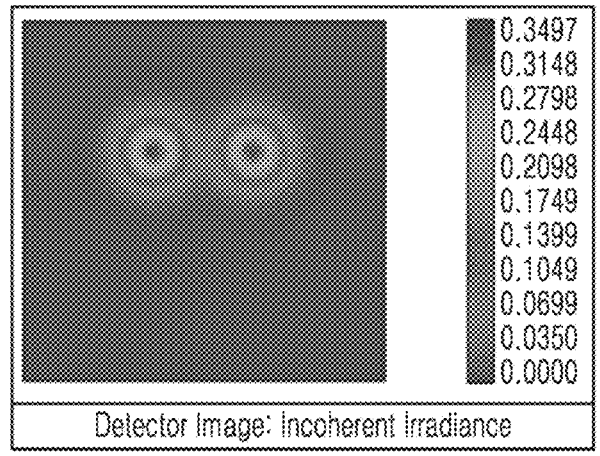
FIG. 8C is a cross-sectional view illustrating an intensity distribution of beams incident on a beam shaping unit in a laser device according to an embodiment.

FIG. 8A is a cross-sectional view illustrating an intensity distribution of beams incident on a beam shaping unit in a laser device according to a laser device of a comparative example. FIG. 8B is a cross-sectional view illustrating an intensity distribution of beams incident on a beam shaping unit in a laser device according to a laser device of a comparative example. FIG. 8C is a cross-sectional view illustrating an intensity distribution of beams incident on a beam shaping unit in a laser device according to an embodiment.

Figure 9A:
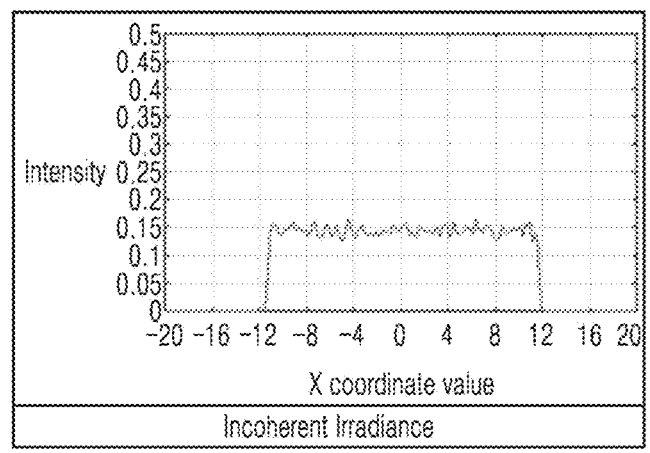
FIG. 9A is a graph showing a beam intensity distribution of spots formed on a target object through the beam shaping unit of FIG. 8A.
Figure 9B:
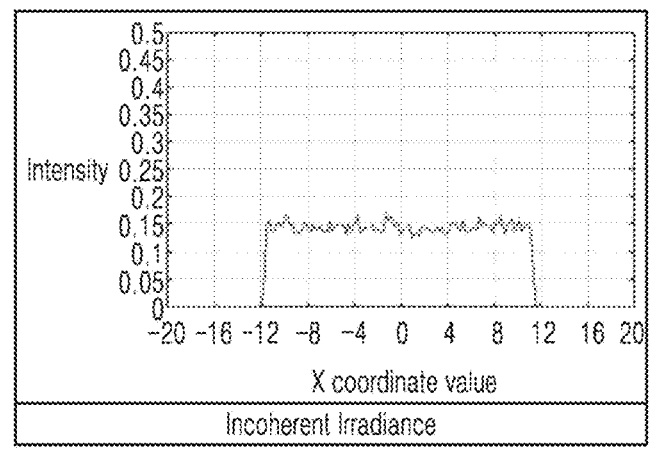
FIG. 9B is a graph showing a beam intensity distribution of spots formed on a target object through the beam shaping unit of FIG. 8B.
Figure 9C:
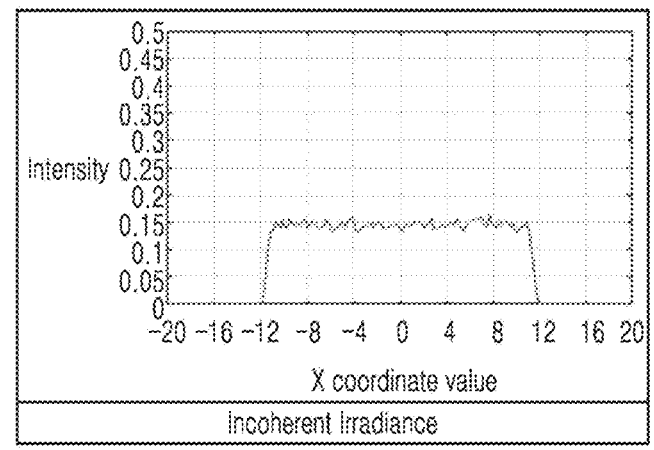
FIG. 9C is a graph showing a beam intensity distribution of spots formed on a target object through the beam shaping unit of FIG. 8C.
Figure 10:
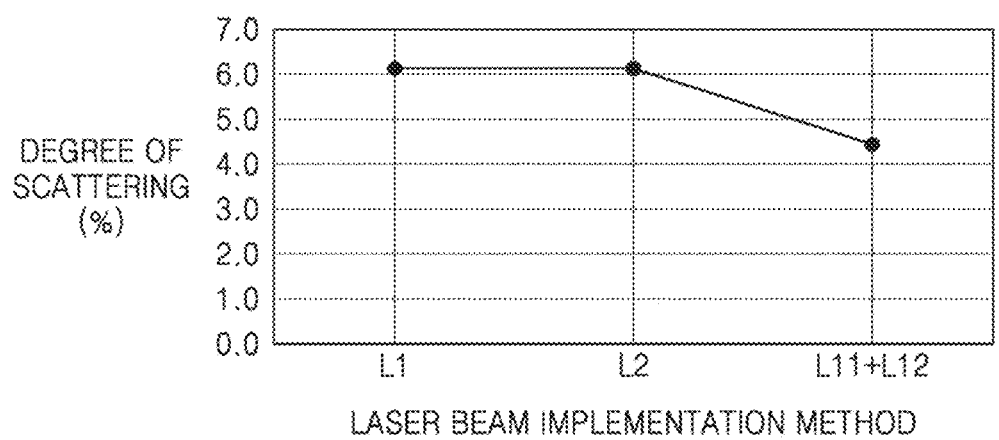
FIG. 10 illustrates a degree of beam intensity scattering of the spots of FIGS. 9A, 9B, 9C.

FIG. 9A is a graph showing a beam intensity distribution of spots formed on a target object through the beam shaping unit in FIG. 8A. FIG. 9B is a graph showing a beam intensity distribution of spots formed on a target object through the beam shaping unit of FIG. 8B. FIG. 9C is a graph showing a beam intensity distribution of spots formed on a target object through the beam shaping unit of FIG. 8C. FIG. 10 illustrates a degree of beam intensity scattering of the spots of FIGS. 9A, 9B, 9C.

FIG. 8A and FIG. 8B corresponding to the comparative example show that the first laser beam L1 and the second laser beam L2 are respectively emitted to the first region R1 and the second region R2 of the incident surface of the beam shaping unit 30 without combination/splitting. FIG. 9A and FIG. 9B show that when the first laser beam L1 and the second laser beam L2 are formed on the target object T (image forming surface), each of the first laser beam L1 and the second laser beam L2 has a flat-top shaped intensity distribution.

FIG. 8C corresponding to the present embodiment shows that the 1-1th partial laser beam L11 and the 1-2th partial laser beam L12 are simultaneously emitted to the first region R1 and the second region R2 of the incident surface of the beam shaping unit 30. FIG. 9C illustrates that when the 1-1th partial laser beam L11 and the 1-2th partial laser beam L12 are formed on the target object T (image forming surface), each of the 1-1th partial laser beam L11 and the 1-2th partial laser beam L12 has a flat-top shaped intensity distribution.

Referring to FIG. 10, it is found that a degree of beam intensity scattering in FIG. 9A and FIG. 9B is about 6%, and a degree of beam intensity scattering in FIG. 9C is about 4.5%. That is, it is found that a degree of scattering in a flat-top shaped intensity distribution when the combination/split unit 20 is used as in the present embodiment is about 25% lower than that when the combination/split unit is not used. In other words, when the combination/split unit 20 is used as in the present embodiment, the laser device 1 may emit a laser beam having a more uniform flat-top shaped beam intensity distribution to the target object T.

Although the light source unit 10 of the laser device 1 described with reference to FIGS. 1 through 10 includes four laser light sources, as long as the number of laser light sources of the light source unit 10 is at least 2, uniformity in a flat-top shaped beam intensity distribution may be improved through combination and splitting of optical paths. Also, although the laser device 1 of the above embodiment splits an optical path into two optical paths for each light source, the present disclosure is not limited thereto. The number of optical paths split for each light source may be greater than 2, by additionally locating a splitter of the combination/split unit 20.

Figure 11:
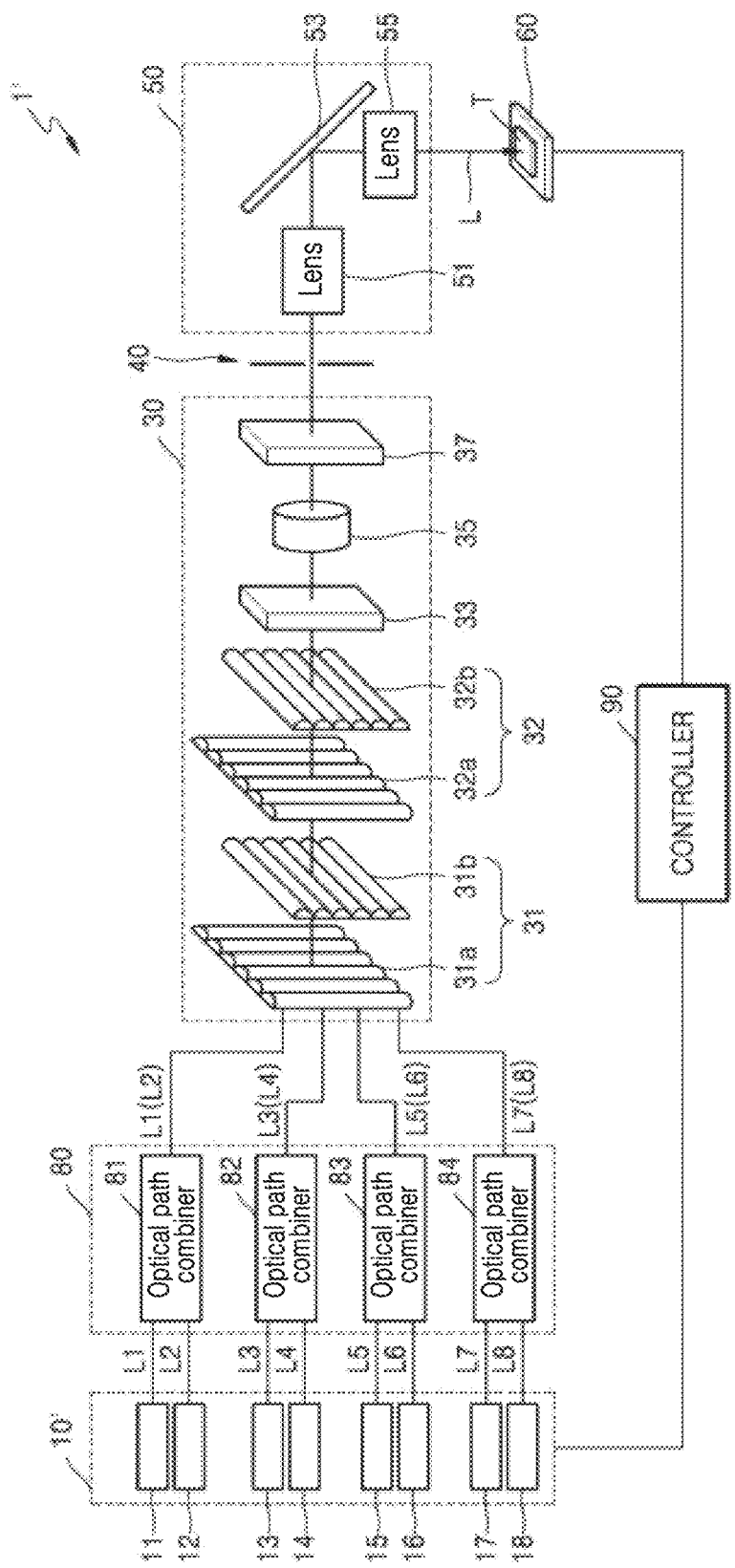
FIG. 11 is a view illustrating an optical configuration of a laser device according to another embodiment.

FIG. 11 is a view illustrating an optical configuration of a laser device 1' according to another embodiment.

Referring to FIG. 11, the laser device 1' of the present embodiment may include a light source unit 10', an optical path combiner 80, the beam shaping unit 30, and the imaging optical system 50. In the laser device 1' of the present embodiment, the number of laser light sources of the light source unit 10 is 8, increased from 4, and the optical path combiner 80, instead of the combination/split unit 20, is used when compared to the laser device 1 described with reference to FIGS. 1 through 10, and thus, a repeated description will be omitted and the following will focus on a difference.

The light source unit 10' includes first through eighth laser light sources 11, 12, 13, 14, 15, 16, 17, and 18. The first through eighth laser light sources 11, 12, 13, 14, 15, 16, 17, and 18 may be driven at different times by the controller 90 to sequentially emit first through eighth laser beams L1, L2, L3, L4, L5, L6, L7, and L8 having a pulse waveform. All of the first through eighth laser beams L1, L2, L3, L4, L5, L6, L7, and L8 may be polarized. For example, the first through eighth laser beams L1, L2, L3, L4, L5, L6, L7, and L8 may be linearly polarized. The first through eighth laser beams L1, L2, L3, L4, L5, L6, L7, and L8 are shaped by the beam shaping unit 30 to have a flat-top shaped intensity distribution, and pass through the imaging optical system 50 and are emitted to the target object T. The first through eighth laser beams L1, L2, L3, L4, L5, L6, L7, and L8 emitted to the target object T are time-sequentially overlaid, and may be considered as a flat-top laser beam having a variable pulse width.

Figure 12:
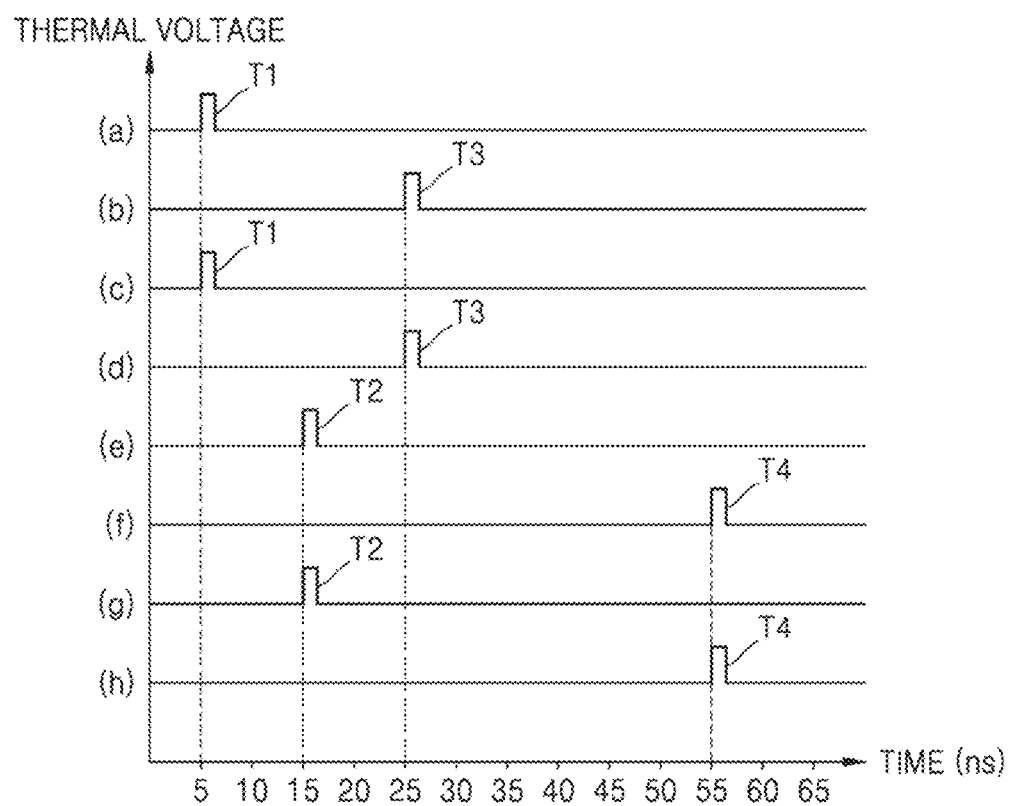
FIG. 12 illustrating driving timings of laser light sources in the laser device of FIG. 11.

FIG. 12 illustrates driving timings of laser light sources in the laser device of the present embodiment. In detail, (a) of FIG. 12 shows a driving timing T1 of the first laser light source 11, (b) of FIG. 12 shows a driving timing T3 of the second laser light source 12, (c) of FIG. 12 shows the driving timing T1 of the third laser light source 13, (d) of FIG. 12 shows the driving timing T3 of the fourth laser light source 14, (e) of FIG. 12 shows a driving timing T2 of the fifth laser light source 15, (f) of FIG. 12 shows a driving timing T4 of the sixth laser light source 16, (g) of FIG. 12 shows the driving timing T2 of the seventh laser light source 17, and (h) of FIG. 12 shows the driving timing T4 of the eighth laser light source 18. Referring to FIG. 12, the first and third laser light sources 11 and 13 are simultaneously driven, the fifth and seventh laser light sources 15 and 17 are simultaneously driven after a certain time, the second and fourth laser light sources 12 and 14 are simultaneously driven after a certain time, and then the sixth and eighth laser light sources 16 and 18 are simultaneously driven after a certain time. An order of driving the first through eighth laser light sources 11, 12, 13, 14, 15, 16, 17, and 18 may vary according to an optical system arrangement of the optical path combiner 80. An overall pulse width of a laser beam emitted to the target object T may be varied, by appropriately setting driving timings of the first through eighth laser light sources 11, 12, 13, 14, 15, 16, 17, and 18, and a heating temperature of a processing surface of the target object T may be adjusted to an appropriate level.

Referring back to FIG. 11, the optical path combiner 80 may include first through fourth optical path combiners 81, 82, 83, and 84.

Figure 13:
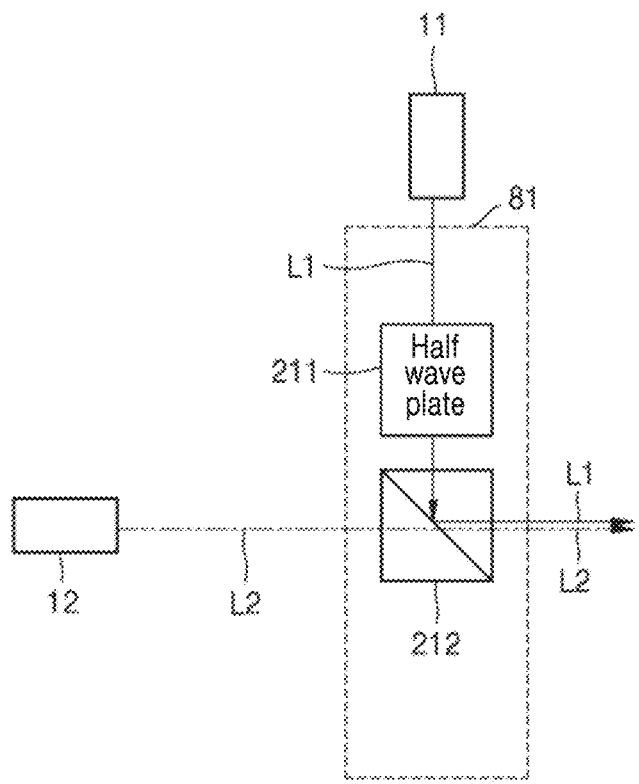
FIG. 13 is a view illustrating an optical configuration of an optical path combiner according to an embodiment.

FIG. 13 is a view illustrating an optical configuration of the first optical path combiner 81 according to an embodiment. Referring to FIG. 13, the first optical path combiner 81 may include a combination of the half-wave plate 211 and the polarization beam splitter 212. The half-wave plate 211 may be located at an emitting end of the first laser light source 11 and may convert a first polarization (e.g., P polarization) of the first laser beam L1 into a second polarization (e.g., S polarization) perpendicular to the first polarization. The polarization beam splitter 212 may include a first incident surface, a second incident surface, an exit surface, and a polarization-selective reflection layer that is diagonally provided thereinside. The polarization-selective reflection layer may be configured to transmit a laser beam of the first polarization (e.g., P polarization) and reflect a laser beam of the second polarization (e.g., S polarization) perpendicular to the first polarization. The first laser beam L1 emitted by the first laser light source 11 passes through the half-wave plate 211, is reflected by the polarization-selective reflection layer of the polarization beam splitter 212, and is emitted through the exit surface, and the second laser beam L2 emitted by the second laser light source 12 passes through the polarization-selective reflection layer and is emitted through the exit surface, and thus, optical paths of the first and second laser beams L1 and L2 are combined into one optical path. As shown in FIG. 12, because the first laser light source 11 and the second laser light source 12 are time-sequentially driven, the first laser beam L1 and the second laser beam L2 time-sequentially travel along one optical path combined through the optical path combiner. The optical path combined through the first optical path combiner 81 is directed to a region (e.g., R1 of FIG. 14) of an incident surface of the beam shaping unit 30. Likewise, the second optical path combiner 82 combines optical paths of the third and fourth laser beams L3 and L4 and a combined optical path is directed to a region (e.g., R2 of FIG. 14) of the incident surface of the beam shaping unit 30, the third optical path combiner 83 combines optical paths of the fifth and sixth laser beams L5 and L6 and a combined optical path is directed to a region (e.g., R3 of FIG. 14) of the incident surface of the beam shaping unit 30, and the fourth optical path combiner 84 combines optical paths of the seventh and eighth laser beams L7 and L8 and a combined optical path is directed to a region (e.g., R4 of FIG. 14) of the incident surface of the beam shaping unit 30.

Optical configurations of the second through fourth optical path combiners 82, 83, and 84 are substantially the same as that of the first optical path combiner 81, and thus, a detailed description thereof will be omitted.

Figure 14:
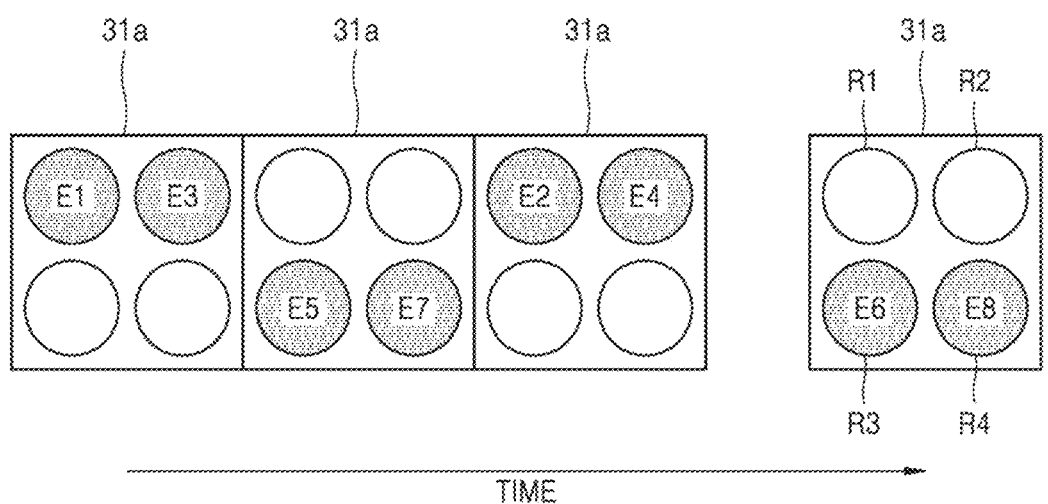
FIG. 14 is a view illustrating an energy distribution when beams are combined by an optical path combiner and time-sequentially incident on a beam shaping unit in the laser device of FIG. 11.

FIG. 14 is a view illustrating an energy distribution when the first through eighth laser beams L1, L2, L3, L4, L5, L6, L7, and L8 are combined by an optical path combiner and time-sequentially incident on a beam shaping unit in the laser device 1' of FIG. 11.

Referring to FIG. 14, the first and third laser light sources 11 and 13 are simultaneously driven during the driving timing T1, and the first and third laser beams L1 and L3 are respectively incident on the first and second regions R1 and R2 of the incident surface of the beam shaping unit 30. Because the first and third laser beams L1 and L3 are incident on the incident surface of the beam shaping unit 30 without splitting, energy E1 of the first laser beam L1 is emitted to the first region R1 and energy E3 of the third laser beam L3 is emitted to the second region R2, during the driving timing T1. Time-sequentially, during the driving timing T2, energy E5 of the fifth laser beam L5 is emitted to the third region R3 and energy E7 of the seventh laser beam L7 is emitted to the fourth region R4. During the driving timing T3, energy E2 of the second laser beam L2 is emitted to the first region R1 and energy E4 of the fourth laser beam L4 is emitted to the second region R2. During the driving timing T4, energy E6 of the sixth laser beam L6 is emitted to the third region R3 and energy E8 of the eighth laser beam L8 is emitted to the fourth region R4.

Similarly to the embodiment described with reference to FIGS. 1 through 10, because a plurality of laser beams are simultaneously emitted to different regions of the incident surface of the beam shaping unit 30, uniformity of a flat-top shaped intensity distribution of a laser beam shaped by the beam shaping unit may be improved.

Although the incident surface of the beam shaping unit 30 is divided into four regions and every two regions are time-sequentially illuminated by using eight laser light sources in the present embodiment, the present disclosure is not limited thereto. For example, nine or more laser light sources may be used, or the incident surface of the beam shaping unit 30 may be divided into five or more regions.

While a variable pulse width flat-top laser device and an operating method therefor according to the present disclosure have been described with reference to the embodiments illustrated in the drawings for better understanding, they are provided for the purposes of illustration and it will be understood by one of ordinary skill in the art that various modifications and equivalents may be made. Accordingly, the true technical scope of the present disclosure is defined by the accompanying claims.

The invention claimed is:
1. A laser device comprising:
a light source configured to emit a plurality of laser beams including a first to fourth laser beams; and
a homogenizer configured to receive the plurality of laser beams on an incident surface of the homogenizer and to form at least one processing beam based on the plurality of laser beams, the at least one processing beam being used for processing a target object,
wherein the homogenizer is further configured:
to have the incident surface including four quadrants arranged along two axes perpendicular to each other, with each quadrant receiving at least some of the plurality of laser beams, and
to shape the plurality of laser beams being emitted at different timings into at least one processing beam.

2. The laser device of claim 1, wherein the at least one processing beam includes a first processing beam shaped from the first to third laser beams,
   wherein the homogenizer is further configured to shape the fourth laser beam into a second processing beam, and
   wherein a pulse width of the first processing laser beam is greater than a pulse width of the second processing laser beam.

3. The laser device of claim 1, wherein the first laser beam is emitted at a first timing, the second laser beam is emitted at a second timing after the first timing and the third laser beam is emitted at a third timing, and
   wherein a first time difference between the first timing and the second timing is same with a second time difference between the second timing and the third timing.

4. The laser device of claim 3, wherein the fourth laser beam is emitted at a fourth timing, and
   wherein a third time difference between the third timing and the fourth timing is greater than the first time difference and the second time difference.

5. The laser device of claim 1, wherein the at least one processing beam includes a first processing beam shaped from the first to third laser beams,
   wherein the first laser beam is emitted at a first timing, the second laser beam is emitted at a second timing after the first timing and the third laser beam is emitted at a third timing,
   wherein a pulse width of the first processing beam is adjusted based on a first time difference between the first timing and the second timing and a second time difference between the second timing and the third timing, and
   wherein a heating temperature of a processing surface of the target object is controlled based on the pulse width of the first processing beam.

6. The laser device of claim 1, wherein the at least one processing beam is a flat-top laser beam.

7. The laser device of claim 1, further comprising:
   an imaging optics includes a lens and a mirror for focusing the at least one processing beam on the target object.

8. The laser device of claim 1, further comprising:
   a stage on which the target object is mounted,
   wherein an annealing process is performed by emitting the at least one processing beam to the target object.

9. The laser device of claim 1, wherein the light source comprises a first laser light source emitting the first laser beam and a second laser light source emitting the second laser beam.

10. An operating method of a laser device, the operating method comprising:
    emitting, by a light source, a plurality of laser beams including a first to fourth laser beams at different timings;
    causing, by an optical component, the plurality of laser beams to be incident on an incident surface of a homogenizer, wherein the incident surface includes four quadrants arranged along two axes perpendicular to each other, with each quadrant receiving at least some of the plurality of laser beams; and
    shaping, by the homogenizer, the plurality of laser beams being emitted at different timings into at least one processing beam, the at least one processing beam being used for processing a target object.

11. The operating method of claim 10, wherein the at least one processing beam includes a first processing beam shaped from the first to third laser beams,
    wherein the homogenizer is further configured to shape the fourth laser beam into a second processing beam, and
    wherein a pulse width of the first processing laser beam is greater than a pulse width of the second processing laser beam.

12. The operating method of claim 10, wherein the first laser beam is emitted at a first timing, the second laser beam is emitted at a second timing after the first timing and the third laser beam is emitted at a third timing, and
    wherein a first time difference between the first timing and the second timing is same with a second time difference between the second timing and the third timing.

13. The operating method of claim 12, wherein the fourth laser beam is emitted at a fourth timing, and
    wherein a third time difference between the third timing and the fourth timing is greater than the first time difference and the second time difference.

14. The operating method of claim 10, wherein the at least one processing beam includes a first processing beam shaped from the first to third laser beams,
    wherein the first laser beam is emitted at a first timing, the second laser beam is emitted at a second timing after the first timing and the third laser beam is emitted at a third timing,
    wherein a pulse width of the first processing beam is adjusted based on a first time difference between the first timing and the second timing and a second time difference between the second timing and the third timing, and
    wherein a heating temperature of a processing surface of the target object is based on controlled the pulse width of the first processing beam.

15. The operating method of claim 10, wherein the at least one processing beam is a flat-top laser beam.

16. The operating method of claim 10, further comprising:
    focusing, by an imaging optics including a lens and a mirror, the at least one processing beam on the target object.

17. The operating method of claim 10,
    wherein an annealing process is performed by emitting the at least one processing beam to the target object.

18. The operating method of claim 10, wherein the light source comprises a first laser light source emitting the first laser beam and a second laser light source emitting the second laser beam.

* * * * *